(12) United States Patent
Tsai et al.

(10) Patent No.: US 12,266,620 B2
(45) Date of Patent: Apr. 1, 2025

(54) MANUFACTURING METHOD OF FLIP CHIP PACKAGE STRUCTURE

(71) Applicant: AMAZING COOL TECHNOLOGY CORP., Taipei (TW)

(72) Inventors: Shiann-Tsong Tsai, Taipei (TW); Yang-Ming Shih, Taipei (TW); Hung-Yun Hsu, Taipei (TW)

(73) Assignee: AMAZING COOL TECHNOLOGY CORP., Taipei (TW)

( * ) Notice: Subject to any disclaimer, the term of this patent is extended or adjusted under 35 U.S.C. 154(b) by 0 days.

(21) Appl. No.: 18/592,048

(22) Filed: Feb. 29, 2024

(65) Prior Publication Data
US 2024/0203914 A1 Jun. 20, 2024

Related U.S. Application Data

(62) Division of application No. 17/674,312, filed on Feb. 17, 2022, now Pat. No. 11,955,443.

(51) Int. Cl.
*H01L 23/00* (2006.01)

(52) U.S. Cl.
CPC .............. *H01L 24/03* (2013.01); *H01L 24/05* (2013.01); *H01L 24/11* (2013.01); *H01L 24/13* (2013.01); *H01L 2224/03826* (2013.01); *H01L 2224/03831* (2013.01); *H01L 2224/0401* (2013.01); *H01L 2224/05647* (2013.01); *H01L 2224/1147* (2013.01); *H01L 2224/13147* (2013.01); *H01L 2224/13611* (2013.01); *H01L 2924/01006* (2013.01); *H01L 2924/014* (2013.01)

(58) Field of Classification Search
CPC ......... H01L 24/03; H01L 24/05; H01L 24/11; H01L 24/13; H01L 2224/03826; H01L 2224/03831; H01L 2224/0401; H01L 2224/05647; H01L 2224/1147; H01L 2224/13147; H01L 2924/014; H01L 24/08; H01L 24/81
See application file for complete search history.

(56) References Cited

U.S. PATENT DOCUMENTS

| | | | |
|---|---|---|---|
| 8,405,199 B2* | 3/2013 | Lu | H01L 24/13 |
| | | | 257/692 |
| 2014/0166194 A1* | 6/2014 | Hu | G03F 7/0002 |
| | | | 228/264 |

* cited by examiner

*Primary Examiner* — Douglas W Owens
(74) *Attorney, Agent, or Firm* — Chun-Ming Shih; HDLS IPR SERVICES (57) ABSTRACT

A manufacturing method of a flip chip package structure is provided and has following steps: providing at least one silicon substrate having a connecting surface and at least one conductive base attached to the connecting surface; arranging a graphene copper layer covering the conductive base; laminating a photoresist layer on the connecting surface, etching the photoresist layer to form a cavity corresponding to the conductive base, and a portion of the graphene copper layer corresponding to the conductive base being exposed on a bottom of the cavity; electroplating a copper material on the graphene copper layer, and the copper material being accumulated in the cavity to form a copper pillar; removing the photoresist layer and the graphene copper layer covered by the photoresist layer.

12 Claims, 7 Drawing Sheets

MANUFACTURING METHOD OF FLIP CHIP PACKAGE STRUCTURE

CROSS-REFERENCE TO RELATED APPLICATION

This application is a divisional application of U.S. patent application Ser. No. 17/674,312, filed on Feb. 17, 2022, and entitled "FLIP CHIP PACKAGE STRUCTURE AND MANUFACTURING METHOD THEREOF". The entire disclosures of the above application are all incorporated herein by reference.

BACKGROUND

Technical Field

The disclosure relates to a chip package, particularly to a flip chip package structure with a copper pillar bump having a single-layer metal bottom layer and a manufacturing method thereof.

Related Art

In related manufacturing processes of chip package, the electric connection between a chip and a substrate usually adopts wire bonding or flip chip bonding. The related-art wire bonding cannot satisfy the electric requirements any longer as integrates circuits are required to be more compact with higher pin counts and to operate at higher frequency. In comparison with the wire bonding, the flip chip bonding may arrange more pins in the same surface area. The flip chip makes a chip plane face downward and connect with a substrate by a copper pillar on the chip plane as a bump. It increases density of chip pins, reduces noise interference, enhances electric performance, improves cooling ability, and decreases package volume. The copper pillar bump of the flip chip package structure is connected to a pin contact of the circuit on a chip by an under bump metallization (UBM). The UBM metal layer is usually composed of multiple laminated metal layers. For example, a related-art UBM metal layer structure covers a titanium metal layer of metallic pads (usually aluminum) on a substrate and further covers a copper metal layer of the titanium metal layer. It utilizes the titanium metal layer associating with both the metallic pads and the copper metal layer to form copper pillar bumps by electroplating the copper metal layer with copper. Titanium material is expensive and the UBM metal layer has to be sputtered or deposited layer by layer, so the manufacturing costs are difficult to be reduced.

In view of this, the inventors have devoted themselves to the above-mentioned related art, researched intensively and cooperated with the application of science to try to solve the above-mentioned problems.

SUMMARY

The disclosure provides a flip chip package structure and a manufacturing method thereof, and the copper pillar bump of the flip chip package structure is connected to a silicon substrate with a single-layer metal layer.

The disclosure provides a manufacturing method of a flip chip package structure, which includes the steps of: a) providing at least one silicon substrate, wherein the silicon substrate includes a connecting surface, and the connecting surface is attached with at least one conductive base; b) covering the conductive base with a graphene copper layer; c) laminating a photoresist layer on the connecting surface and etching the photoresist layer to form a cavity corresponding to the conductive base in position, wherein a part of the graphene copper layer corresponding to the conductive base is exposed on a bottom of the cavity; d) electroplating a copper material on the graphene copper layer, wherein the copper material is accumulated in the cavity to form a copper pillar; and e) removing the photoresist layer and the graphene copper layer covered by the photoresist layer.

In the manufacturing method of the disclosure, wherein the step b) includes the steps of laminating and covering the connecting surface of the silicon substrate with a passivation layer and etching the passivation layer to expose the conductive base, and covering the passivation layer with the graphene copper layer and the graphene copper layer covering the exposed conductive base. The graphene copper layer is sputtered or deposited on the passivation layer.

In the manufacturing method of the disclosure, the connecting surface of the silicon substrate is covered with a passivation layer, and the conductive base is exposed from the passivation layer. The graphene copper layer includes a copper body. The copper body is a lamination and covers the conductive base. The copper body is embedded with multiple graphene fragments, and the graphene fragments are discretely distributed in the copper body.

The manufacturing method of the disclosure further includes the step of electroplating a solder on a top of the copper pillar. The solder is filled in the cavity.

In the manufacturing method of the disclosure, the solder is an alloy at least having tin. The solder further includes silver, nickel, or graphene.

In the manufacturing method of the disclosure, a chip or a wafer is provided, and the silicon substrate is formed on the chip or the wafer.

In the manufacturing method of the disclosure, the conductive base is made of aluminum.

The disclosure further provides a flip chip package structure, which includes a silicon substrate, a graphene copper layer, and a coper pillar. The silicon substrate has a connecting surface and the connecting surface is attached with at least one conductive base. The graphene copper layer covers the conductive base. The copper pillar is upright disposed on the connecting surface and connected to the graphene copper layer.

In the flip chip package structure of the disclosure, a thickness of the graphene copper layer is between about 0.01 µm and about 1.5 µm. The graphene copper layer includes a copper body. The copper body is a lamination and covers the connecting surface of the silicon substrate. The copper body is embedded with multiple graphene fragments, and the graphene fragments are discretely distributed in the copper body. A thickness of the copper body is between about 0.01 µm and about 1.5 µm.

In the flip chip package structure of the disclosure, the top of the copper pillar is disposed with a solder. The solder is an alloy at least having tin. The solder further includes silver, nickel, or graphene.

In the manufacturing method of a flip chip package structure of the disclosure, the graphene copper layer in the flip chip package structure has graphene, the connective ability between graphene and metal such as copper or aluminum is stronger than the connective ability between metals, so the structure may resist greater shear stress. Thus, a single electroplating layer may be used to serve as the UBM to connect the copper pillar and the conductive base made of aluminum.

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Figure 1:
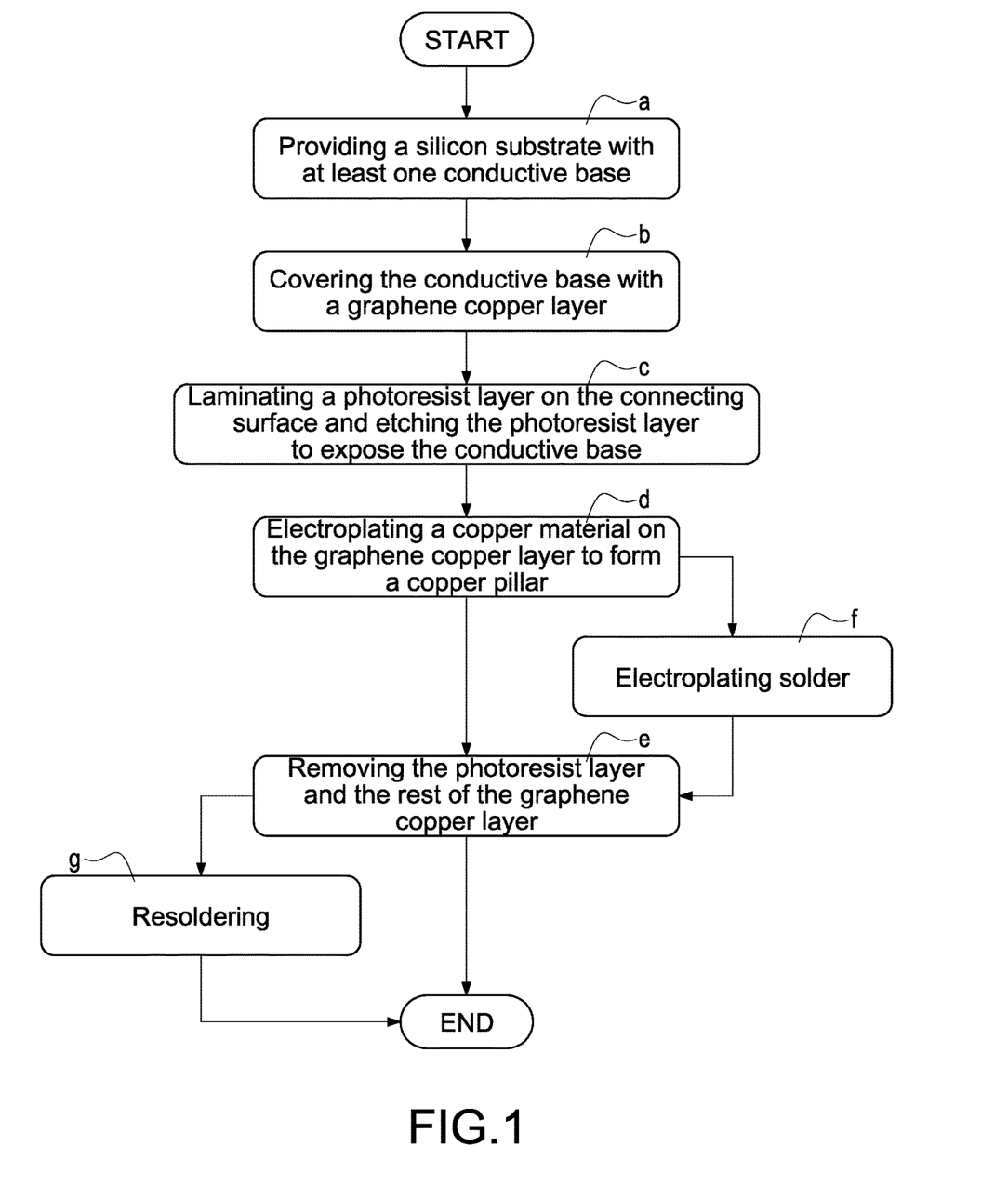
FIGS. 1 and 2 are flowcharts of the manufacturing method of the flip chip package structure of an embodiment of the disclosure.
Figure 2:
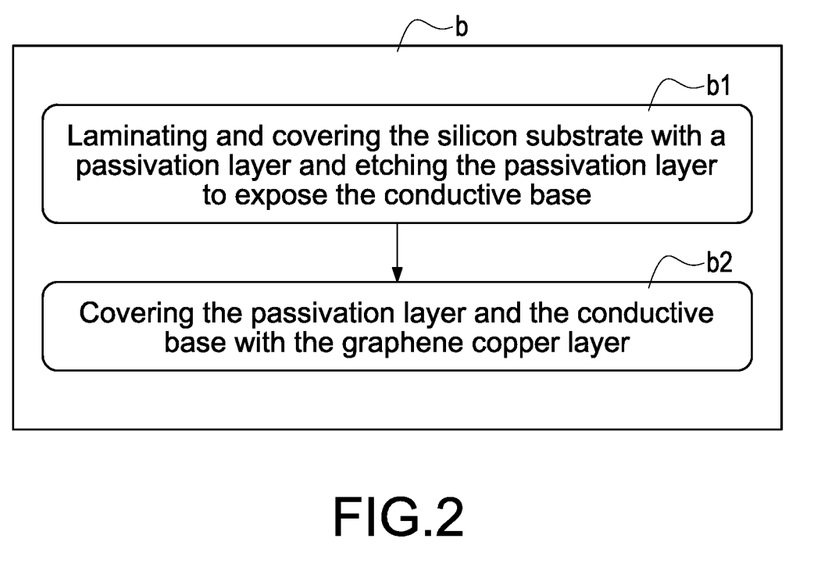

Please refer to FIGS. 1 and 2. An embodiment of the disclosure provides a manufacturing method of a flip chip package structure, which includes the following steps.

Figure 3:
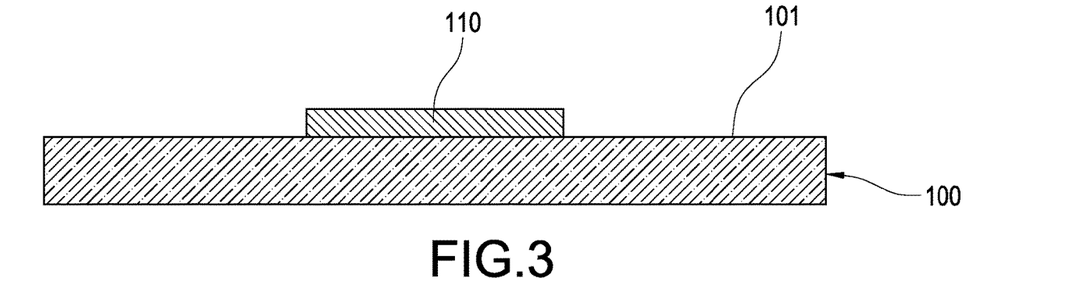
FIGS. 3-11 are schematic view of each step of the manufacturing method of the flip chip package structure of an embodiment of the disclosure.

First, as shown in FIGS. 1 and 3, in step a, at least one silicon substrate 100 is provided. The silicon substrate 100 has a connecting surface 101 for connecting package. The connecting surface 101 is attached with at least one conductive base 110. In some embodiments, the conductive base 110 is made of aluminum. In some embodiments, the silicon substrate 100 is provided with a circuit, the conductive base 110 is electrically connected to the circuit on the silicon substrate 100 and the conductive base 110 may be part of the circuit. As a result, the connecting surface 101 is attached with multiple conductive bases 110. In this step, according to different requirements of the manufacturing process, a single chip may be provided to serve as the silicon substrate 100, or a wafer may be provided to serve as the silicon substrate 100. The wafer may include multiple chips for performing batch package. For the sake of description, the embodiment of the disclosure merely shows part of the silicon substrate 100 and a cross-sectional view of one of the conductive bases 110 as an example.

Figure 6:
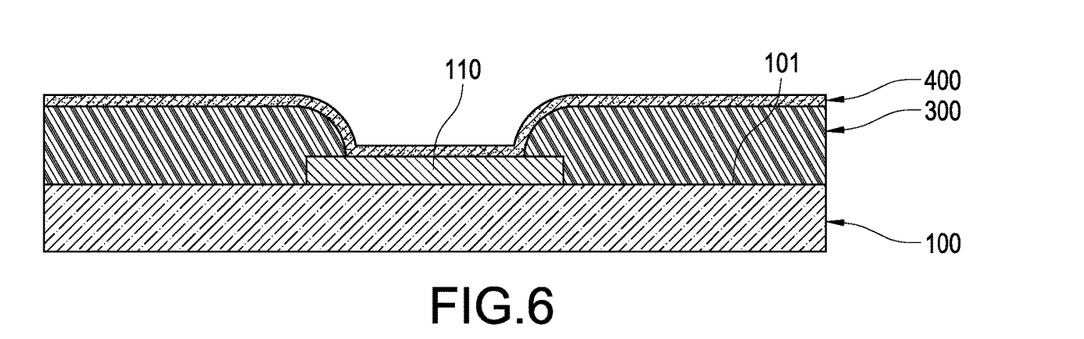
Figure 7:
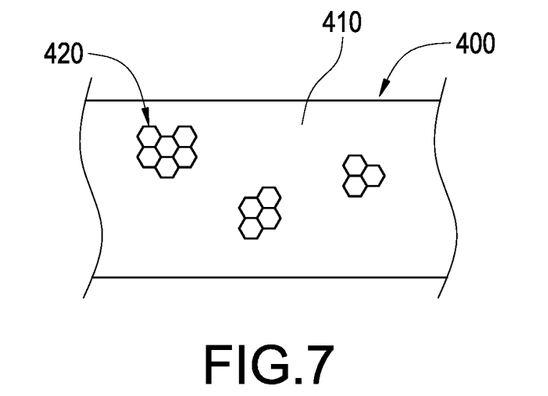

As shown in FIGS. 1 and 6, next to step a, in step b, the conductive base 110 is covered with a graphene copper layer 400 to serve as an under bump metallization (UBM) of the copper pillar 600. In the embodiment, the graphene copper layer 400 is sputtered or deposited on the conductive base 110 with a graphene copper target. As shown in FIG. 7, a thickness of the graphene copper layer 400 is between about 0.01 μm and about 1.5 μm. The structure of the graphene copper layer 400 includes a copper body 410. The copper body 410 is a lamination and covers the connecting surface 101 of the silicon substrate 100. A thickness of the copper body 410 is between about 0.01 μm and about 1.5 μm. The copper body 410 is embedded with multiple graphene fragments 420 and the graphene fragments 420 are discretely distributed in the copper body 410. The graphene fragment 420 is a tiny planar-structure piece composed of carbon atoms arranged in hexagonal bonding.

Figure 4:
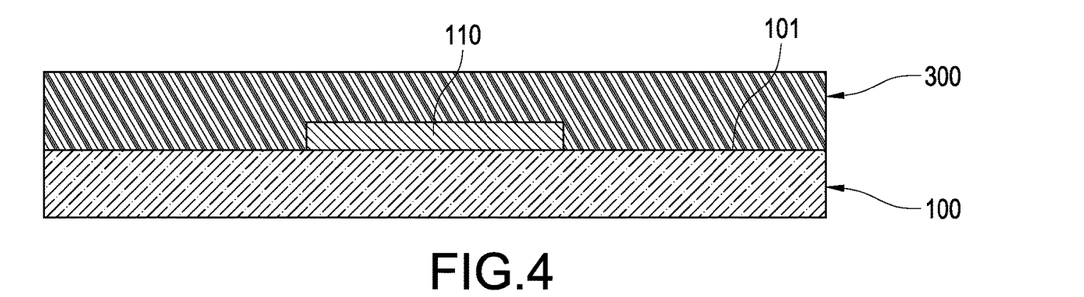
Figure 5:
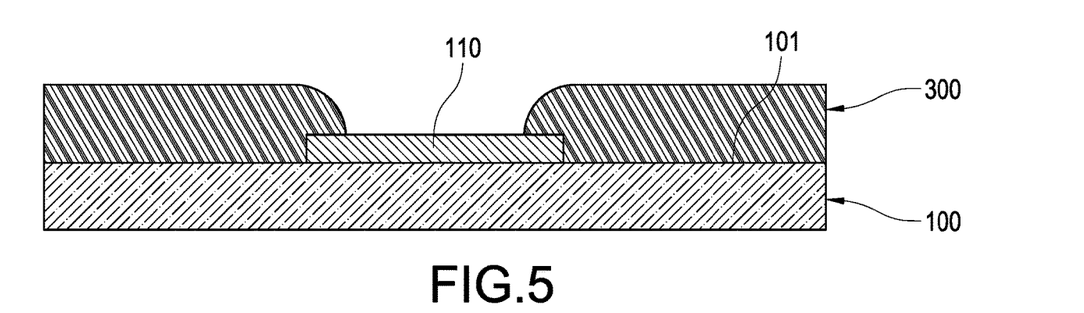

As shown in FIGS. 2, 5 and 6, in detail, step b may include the following sub-steps: in step b1 as shown in FIG. 4, the connecting surface 101 is covered with a passivation layer 300 for insulation and protection. The passivation layer 300 may be polyimide (PI) or silicon nitride ($Si_3N_4$). The passivation layer 300 is etched to expose the conductive base 110 from the passivation layer 300. In step b2 next to step b1, the conductive base 110 is covered with the graphene copper layer 400. In detail, in step b2, the graphene copper layer 400 is stacked on the connecting surface 101 to make the graphene copper layer 400 cover the passivation layer 300 and directly contact the conductive base 110 exposed from the passivation layer 300.

Figure 8:
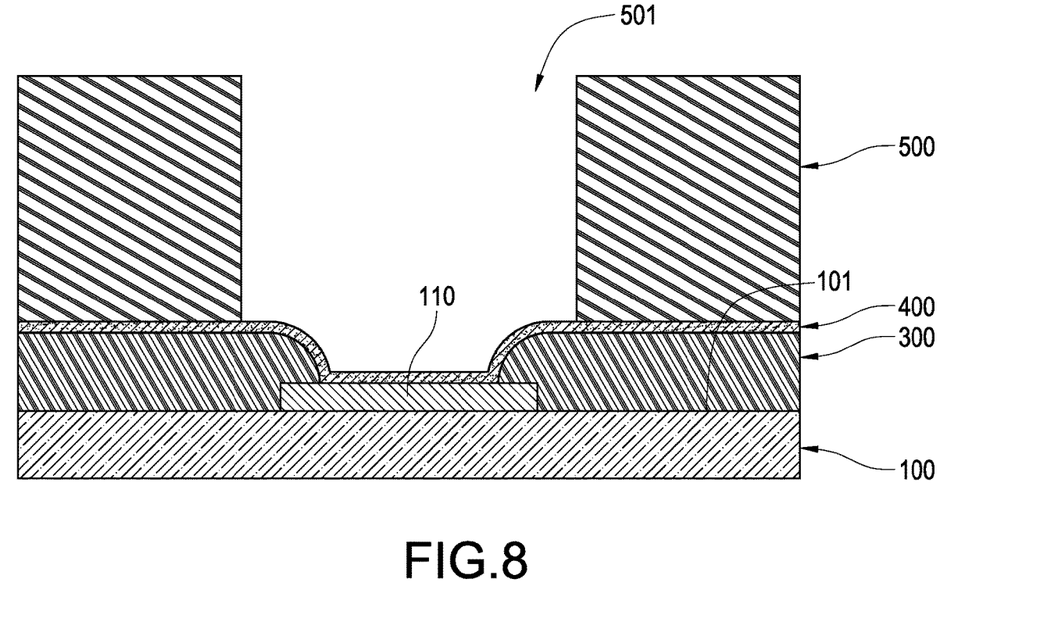

As shown in FIGS. 1 and 8, next to step b, in step c, a photoresist layer (photo resistor) 500 is laminated on the connecting surface 101 of the silicon substrate 100. The main components of the photoresist are resin and sensitizer. In the embodiment, the photoresist layer 500 covers the graphene copper layer 400. Next, the photoresist layer 500 is etched to form a cavity 501 corresponding to the conductive base 110 in position, and a part of the graphene copper layer 400 corresponding to the conductive base 110 is exposed on the bottom of the cavity 501.

Figure 9:
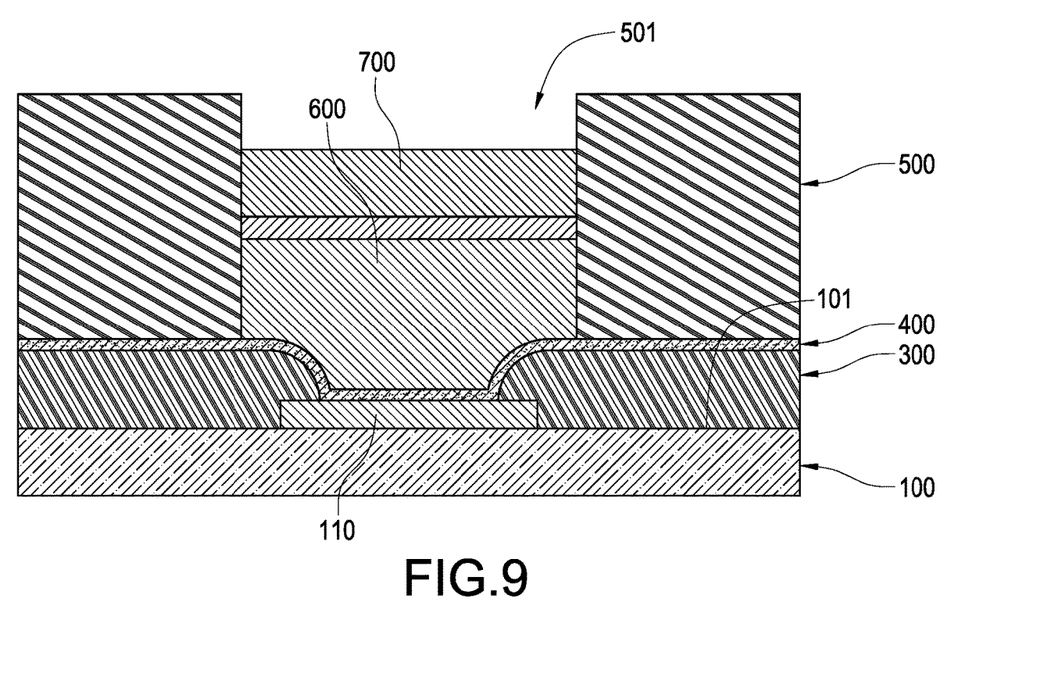

As shown in FIGS. 1 and 9, next to step c, in step d, a copper material is electroplated on the graphene copper layer 400, and the copper material is accumulated in the cavity 501 to form a copper pillar 600. In detail, this step uses a wet process, which soaks the silicon substrate 100 in electrolyte containing copper ions to make copper ions electroplated on the part of the graphene copper layer 400, which is exposed from the cavity 501. The copper plating is accumulated along the inside of the cavity 501 to form a pillar.

Figure 10:
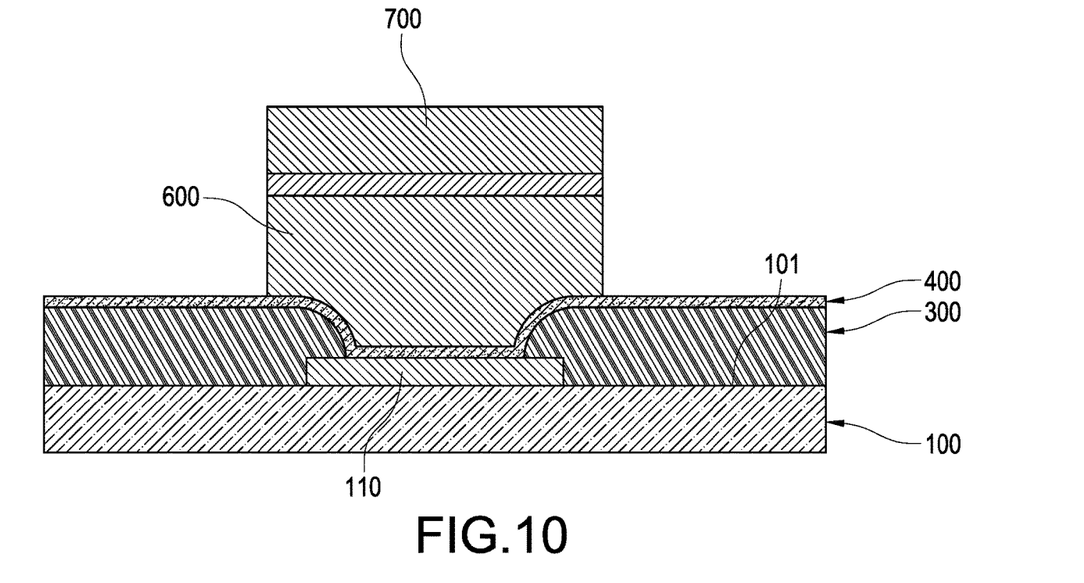
Figure 11:
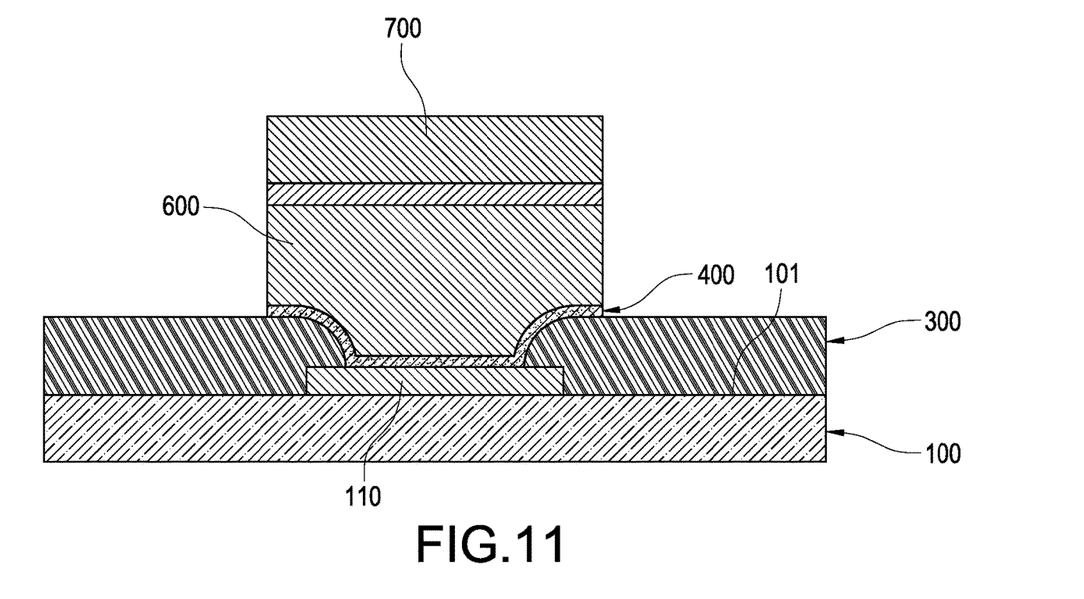

As shown in FIGS. 1, 10 and 11, next to step d, in step e, both the photoresist layer 500 as shown in FIG. 10 and the graphene copper layer 400 covered by the photoresist layer 500 as shown in FIG. 11 are sequentially removed by etching. Therefore, each copper pillar 600 is separately upright fixed on each conductive base 110 on the connecting surface 101 of the silicon substrate 100 through the graphene copper layer 400 to finish the flip chip package structure for implementing the subsequent package process of flip chip.

Figure 12:
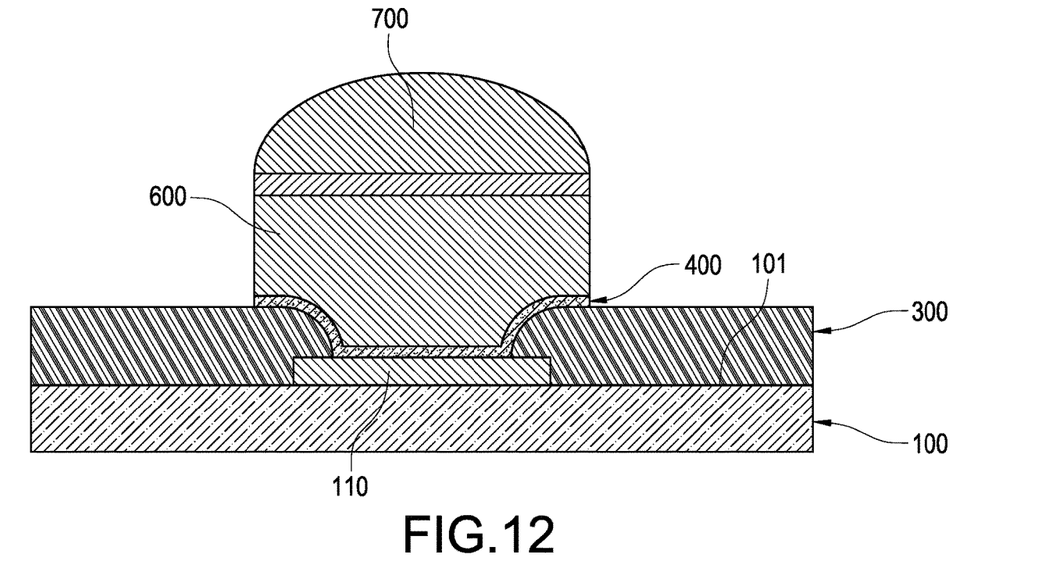
FIG. 12 is a schematic view of the flip chip package structure of an embodiment of the disclosure.

As shown in FIGS. 1 and 8-11, a step f may be added between step c and step d. In step f, the top of the copper pillar 600 is electroplated with a solder 700. The solder 700 is an alloy at least including tin. In the embodiment, the solder 700 may further contain silver, nickel, or the abovementioned graphene fragments 420. In detail, after finishing step c, the top of the copper pillar 600 is exposed in the cavity 501, the solder 700 is electroplated on the exposed surface of the top of the copper pillar 600 by electroplating with the wet process, and the solder 700 plating is accumulated along the inside of the cavity 501. As shown in FIGS. 1 and 12, after finishing step e, a resoldering step g may be performed to heat and soften the solder 700 to cohere to form a hemispheric shape.

As shown in FIG. 12, the abovementioned flip chip structure at least includes a silicon substrate 100, a single graphene copper layer 400 and a coper pillar 600. The silicon substrate 100 has a connecting surface 101 and the connecting surface is attached with at least one conductive base 110. In some embodiments, the conductive base 110 is made of aluminum. In some embodiments, the silicon substrate 100 is provided with a circuit, the conductive base 110 is electrically connected to the circuit on the silicon substrate 100 and the conductive base 110 may be part of the circuit. As a result, the connecting surface 101 is attached with multiple conductive bases 110. The graphene copper layer 400 covers the conductive base 110. A thickness of the graphene copper layer 400 is between about 0.01 μm and about 1.5 μm. The copper pillar 60 is upright disposed on the connecting surface 101 and connected to the graphene copper layer 400.

As shown in FIGS. 7 and 12, the graphene copper layer 400 includes a copper body 410. The copper body 410 is a lamination and covers the connecting surface 101 of the silicon substrate 100. The copper body 410 is embedded with multiple graphene fragments 420 and the graphene fragments 420 are discretely distributed in the copper body 410. A thickness of the copper body 410 is between about 0.01 μm and about 1.5 μm.

In the manufacturing method of a flip chip package structure of the disclosure, the graphene copper layer 400 in the flip chip package structure has graphene, the connective ability between graphene and metal such as copper or aluminum is stronger than the connective ability between metals, so the structure may resist greater shear stress. Thus, a single electroplating layer may be used to serve as the UBM to connect the copper pillar 600 and the conductive base 110 made of aluminum.

While this disclosure has been described by means of specific embodiments, numerous modifications and variations could be made thereto by those skilled in the art without departing from the scope and spirit of this disclosure set forth in the claims.

What is claimed is:

1. A manufacturing method of a flip chip package structure, the manufacturing method comprising:
   a) providing at least one silicon substrate, wherein the silicon substrate comprises a connecting surface, and the connecting surface is attached with at least one conductive base;
   b) covering the conductive base with a graphene copper layer;
   c) laminating a photoresist layer on the connecting surface and etching the photoresist layer to form a cavity corresponding to the conductive base in position, wherein a part of the graphene copper layer corresponding to the conductive base is exposed on a bottom of the cavity;
   d) electroplating a copper material on the graphene copper layer, wherein the copper material is accumulated in the cavity to form a copper pillar; and
   e) removing the photoresist layer and the graphene copper layer covered by the photoresist layer.

2. The manufacturing method of claim 1, wherein the step b) further comprising:
   b1) laminating and covering the connecting surface of the silicon substrate with a passivation layer, and etching the passivation layer to expose the conductive base; and
   b2) covering the passivation layer with the graphene copper layer, wherein the graphene copper layer covers the conductive base being exposed.

3. The manufacturing method of claim 2, further comprising: sputtering or depositing the graphene copper layer on the passivation layer.

4. The manufacturing method of claim 1, wherein the connecting surface of the silicon substrate is covered with a passivation layer, and the conductive base is exposed from the passivation layer.

5. The manufacturing method of claim 1, wherein the graphene copper layer comprises a copper body, the copper body is a lamination and covers the conductive base, the copper body is embedded with multiple graphene fragments, and the graphene fragments are discretely distributed in the copper body.

6. The manufacturing method of claim 1, wherein after the step d), further comprises:
   f) electroplating a solder on a top of the copper pillar.

7. The manufacturing method of claim 6, wherein the solder is filled in the cavity.

8. The manufacturing method of claim 6, wherein the solder is an alloy at least comprising tin.

9. The manufacturing method of claim 8, wherein the solder further comprises silver, nickel, or graphene.

10. The manufacturing method of claim 1, wherein the step a) further comprises: providing a chip, and forming the silicon substrate on the chip.

11. The manufacturing method of claim 1, wherein the step a) further comprises: providing a wafer, and forming the silicon substrate on the wafer.

12. The manufacturing method of claim 1, wherein the conductive base is made of aluminum.

* * * * *